(12) United States Patent
Wang et al.

(10) Patent No.: US 12,131,245 B2
(45) Date of Patent: Oct. 29, 2024

(54) BAYESIAN NEURAL NETWORK AND METHODS AND APPARATUS TO OPERATE THE SAME

(71) Applicant: Intel Corporation, Santa Clara, CA (US)

(72) Inventors: Hechen Wang, Hillsboro, OR (US); Richard Dorrance, Hillsboro, OR (US); Deepak Dasalukunte, Beaverton, OR (US); David Israel Gonzalez Aguirre, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 764 days.

(21) Appl. No.: 17/075,527

(22) Filed: Oct. 20, 2020

(65) Prior Publication Data

US 2021/0034947 A1 Feb. 4, 2021

(51) Int. Cl.
*G06N 3/04* (2023.01)
*G06F 1/06* (2006.01)
(Continued)

(52) U.S. Cl.
CPC ............... *G06N 3/04* (2013.01); *G06F 1/06* (2013.01); *H03L 7/0891* (2013.01); *H03L 7/0995* (2013.01); *G11C 11/412* (2013.01)

(58) Field of Classification Search
CPC .......... G06N 3/04; G06N 3/044; G06N 3/047; G06N 3/065; G06N 3/063; G06N 3/08; G06N 7/01; G06N 20/00; G06F 1/06; G06F 1/04; G06F 1/12; H03L 7/0891; H03L 7/0995; G11C 11/412; G11C 7/02;
(Continued)

(56) References Cited

U.S. PATENT DOCUMENTS 5,057,793 A * 10/1991 Cowley ............... H03L 7/087
331/DIG. 2
2004/0247066 A1* 12/2004 Suda ............... H03L 7/0814
331/25

(Continued)

OTHER PUBLICATIONS

Woorham Bae and Kyung Jean Yoon, "Weight Update Generation Circuit Utilizing Phase Noise of Integrated Complementary Metal-Oxide-Semiconductor Ring Oscillator for Memristor Crossbar Array Neural Network-Based Stochastic Learning" Advanced Intelligent Systems, May 20, 2020 (Year: 2020).*

(Continued)

*Primary Examiner* — Hope C Sheffield
(74) *Attorney, Agent, or Firm* — Hanley, Flight & Zimmerman, LLC

(57) ABSTRACT

Methods, apparatus, systems, and articles of manufacture providing an improved Bayesian neural network and methods and apparatus to operate the same are disclosed. An example apparatus includes an oscillator to generate a first clock signal; a resistive element to adjust a slope of a rising edge of a second clock signal; a voltage sampler to generate a sample based on at least one of (a) a first voltage of the first clock signal when a second voltage of the second clock signal satisfies a threshold or (b) a third voltage of the second clock signal when a fourth voltage of the first clock signal satisfies the threshold; and a charge pump to adjust a weight based on the sample, the weight to adjust data in a model.

20 Claims, 8 Drawing Sheets

(51) Int. Cl.
*H03L 7/089* (2006.01)
*H03L 7/099* (2006.01)
*G11C 11/412* (2006.01)

(58) Field of Classification Search
CPC ..... G11C 7/1006; G11C 7/222; G11C 11/419; G11C 11/54
See application file for complete search history.

(56) References Cited

U.S. PATENT DOCUMENTS

| | | | |
|---|---|---|---|
| 2008/0077357 A1* | 3/2008 | Yamaguchi | G01R 31/31711 702/191 |
| 2013/0002465 A1* | 1/2013 | Kull | H03M 1/0682 341/155 |
| 2016/0191029 A1* | 6/2016 | Shuvalov | H03K 3/0231 327/291 |

OTHER PUBLICATIONS

European Patent Office, "European Search Report," issued in connection with Application No. 21190774.6, dated Feb. 22, 2022, 11 pages.
Gao et al., "Efficient Performance Trade-off Modeling for Analog Circuit based on Bayesian Neural Network," 2019 IEEE/ACM International Conference on Computer-Aided Design (ICCAD), dated Nov. 4-7, 2019, 23 pages.
Meinerzhagen, "Design of a 12-bit low-power SAR A/D Converter for a Neurochip," Master's Thesis, Swiss Federal Institute of Technology, Lausanne, Microelectronic Systems Laboratory, Aug. 15, 2008, 151 pages.
Pattavina, "Charge-Pump Phase-Locked Loop—A Tutorial-Part I," EE|Times, dated Jun. 30, 2011, 12 pages.
European Patent Office, "Communication Pursuant to Article 94(3) EPC," issued in connection with European Patent Application No. 21190774.6-1203, dated Oct. 2, 2023, 10 pages.
Valavi et al., "A 64-Tile 2.4-Mb In-Memory-Computing CNN Accelerator Employing Charge-Domain Compute," IEEE Journal of Solid-State Circuits, vol. 54, No. 6, Jun. 2019, 11 pages.
Cai et al., "Hardware Acceleration of Bayesian Neural Networks using RAM based Linear Feedback Gaussian Random Number Generators," IEEE 35th International Conference on Computer Design (ICCD), Boston, MA, 2017, pp. 289-296, 8 pages.
David Stutz, "A Short Introduction to Bayesian Neural Networks," I AM David Stutz, Article, Nov. 25, 2019, 13 pages.
Bishop, "Bayesian Neural Networks," SciELO, Journal of the Brazilian Computer Society, vol. 4, No. 1, Jul. 1997, 11 pages.
Mullachery et al., "Bayesian Neural Networks," A study of Bayesian Neural Networks, Jan. 23, 2019, 18 pages.
Alioto, "Trends in Hardware Security: From Basics to ASICs," IEEE Solid-State Circuits Magazine, vol. 11, No. 3, pp. 56-74, Aug. 27, 2019 19 pages.
Cai et al., "VIBNN: Hardware Acceleration of Bayesian Neural Networks," Architectural Support for Programming Languages and Operating Systems, Mar. 24-28, 2018, Williamsburg, VA, 13 pages.
European Patent Office, "Communication Pursuant to Article 94(3) EPC," issued in connection with European Patent Application No. 21190774.6, dated Jul. 8, 2024 11 pages.

\* cited by examiner

BAYESIAN NEURAL NETWORK AND METHODS AND APPARATUS TO OPERATE THE SAME

FIELD OF THE DISCLOSURE

This disclosure relates generally to machine learning, and, more particularly, to an improved Bayesian neural network and methods and apparatus to operate the same.

BACKGROUND

In recent years, machine learning and/or artificial intelligence have increased in popularity. For example, machine learning and/or artificial intelligence may be implemented using neural networks. Neural networks are computing systems inspired by the neural networks of human brains. A neural network can receive an input and generate an output. The neural network can be trained (e.g., can learn) based on feedback so that the output corresponds a desired result. Once trained, the neural network can make decisions to generate an output based on any input. Neural networks are used for the emerging fields of artificial intelligence and/or machine learning. A Bayesian neural network is a particular type of neural network that includes neurons that generate a variable weight as opposed to a fixed weight. The variable weight falls within a probability distribution defined by a mean value and a variance determined during training of the Bayesian neural network.

Figure 1:
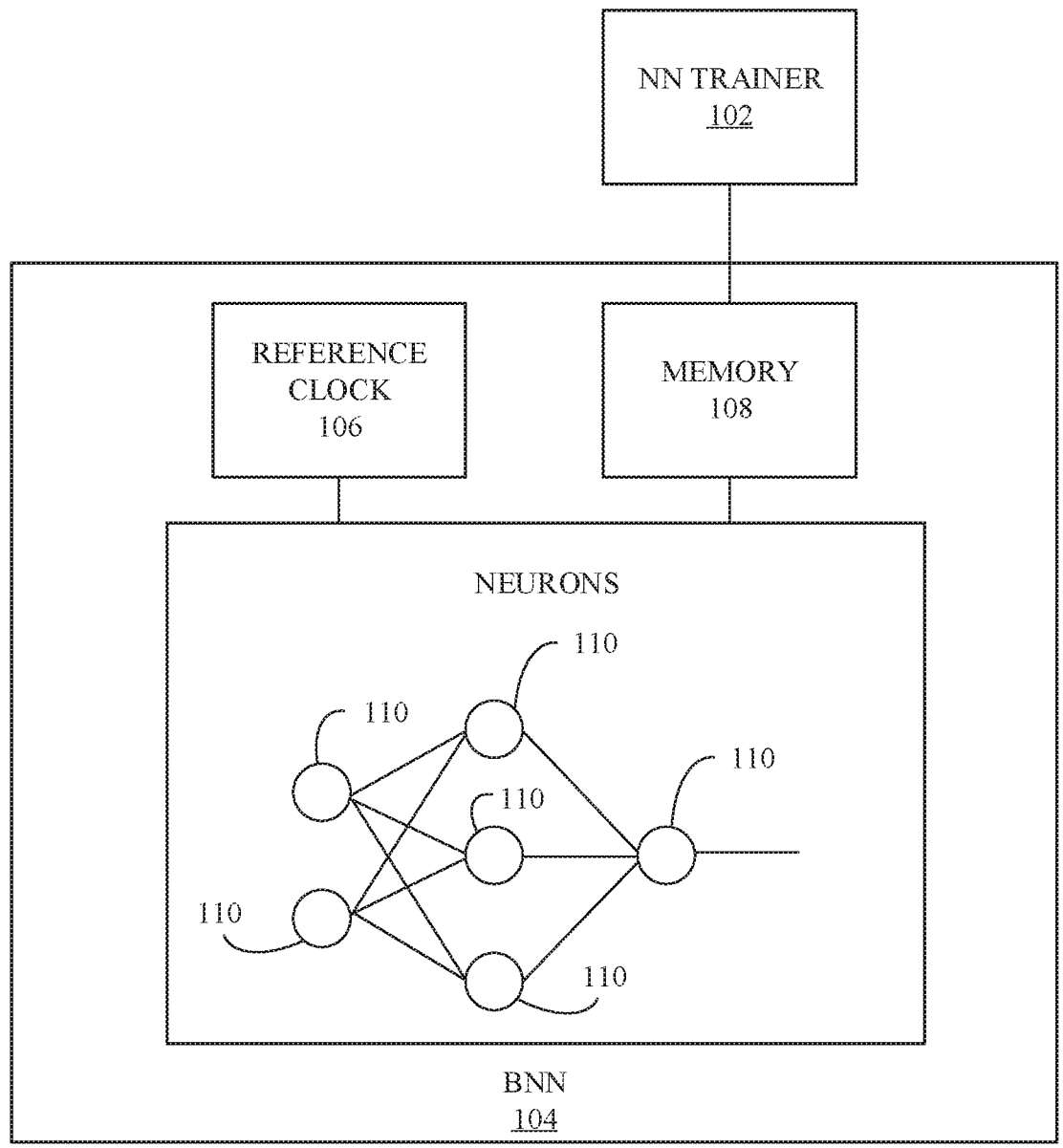
FIG. 1 is a schematic illustration of an example Bayesian neural network.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Machine learning models, such as neural networks, are used to be able to perform a task (e.g., classify data). Machine learning can include a training stage to train the model using ground truth data (e.g., data correctly labelled with a particular classification). Training a traditional neural network adjusts the weights of neurons of the neural network. After trained, data is input into the trained neural network and the weights of the neurons are applied to input data to be able to process the input data to perform a function (e.g., classify data).

Overfitting and sensitivity to malicious attacks negatively affect the performance and/or reliability of traditional neural networks. Overfitting occurs when a model is trained to have too small of an error. If the training results in too small of an error, the model has a difficult time generalizing for new situations. Malicious attacks can exploit a combination of overfitting and/or knowledge of the underlying neural network model. Sensitivity to malicious attacks is the result of a trained model being overconfident in its outputs. If a model is overconfident, small perturbations to the inputs can result in undesired and/or unpredictable changes in the output. Both the above problems are caused by the failure of traditional neural networks to include uncertainty information in a finite set of training data.

Bayesian neural networks (BNNs) introduce uncertainty information to overcome the problems of overfitting and sensitivity to malicious attacks. Instead of using fixed weights, BNNs introduce weights associated with conditioned probability distribution (e.g., the output weight may be a value within a probability distribution defined by a mean (herein also referred to as mu or u) and standard deviation and/or variance). Because BNNs introduce some amount of randomness, BNNs can be trained with smaller training data without sacrificing accuracy. However, traditional BNNs with neurons that generate weights corresponding to a probability distribution require a lot of power and/or hardware to implement. Therefore, such traditional BNNs are expensive, complex, and energy inefficient. Examples disclosed herein correspond to a BNN that is implemented with less hardware (and thus less expensive) and is more energy efficient than traditional BNNs.

Examples disclosed herein leverage the Gaussian distribution corresponding to randomly dithering charge in the analog domain. Examples disclosed herein generates a BNN using (1) a C-2C ladder that converts the mean weight into an electric charge level, (2) a jittery oscillator sampling-based entropy source that provides programmable randomness, and (3) a charge pump controlled by the entropy source to dither (e.g., adjust) the charge generated by the C-2C ladder to give the final, programmable, and Gaussian distributed output weight. Examples disclosed herein results in an analog-based, compute-in-memory (CiM) BNN implementation of a neural network.

In general, implementing a ML/AI system involves two phases, a learning/training phase and an inference phase. In the learning/training phase, a training algorithm is used to train a model to operate in accordance with patterns and/or associations based on, for example, training data. In general, the model includes internal parameters that guide how input data is transformed into output data, such as through a series of nodes and connections within the model to transform input data into output data. Additionally, hyperparameters may be used as part of the training process to control how the learning is performed (e.g., a learning rate, a number of layers to be used in the machine learning model, etc.). Hyperparameters are defined to be training parameters that are determined prior to initiating the training process.

Different types of training may be performed based on the type of ML/AI model and/or the expected output. As used herein, labelling refers to an expected output of the machine learning model (e.g., a classification, an expected output value, etc.). Alternatively, unsupervised training (e.g., used in deep learning, a subset of machine learning, etc.) involves inferring patterns from inputs to select parameters for the ML/AI model (e.g., without the benefit of expected (e.g., labeled) outputs).

In examples disclosed herein, training is performed until a threshold number of actions have been predicted. In examples disclosed herein, training is performed either locally (e.g. in the device) or remotely (e.g., in the cloud and/or at a server). Training may be performed using hyperparameters that control how the learning is performed (e.g., a learning rate, a number of layers to be used in the machine learning model, etc.). In some examples re-training may be performed. Such re-training may be performed in response to a new program being implemented or a new user using the device. Training is performed using training data. When supervised training may be used, the training data is labeled. In some examples, the training data is pre-processed.

Once training is complete, the model is deployed for use as an executable construct that processes an input and provides an output based on the network of nodes and connections defined in the model. The model is stored locally in memory (e.g., cache and moved into memory after trained) or may be stored in the cloud. The model may then be executed by the computer cores.

Once trained, the deployed model may be operated in an inference phase to process data. In the inference phase, data to be analyzed (e.g., live data) is input to the model, and the model executes to create an output. This inference phase can be thought of as the AI "thinking" to generate the output based on what it learned from the training (e.g., by executing the model to apply the learned patterns and/or associations to the live data). In some examples, input data undergoes pre-processing before being used as an input to the machine learning model. Moreover, in some examples, the output data may undergo post-processing after it is generated by the AI model to transform the output into a useful result (e.g., a display of data, an instruction to be executed by a machine, etc.).

In some examples, output of the deployed model may be captured and provided as feedback. By analyzing the feedback, an accuracy of the deployed model can be determined. If the feedback indicates that the accuracy of the deployed model is less than a threshold or other criterion, training of an updated model can be triggered using the feedback and an updated training data set, hyperparameters, etc., to generate an updated, deployed model.

FIG. 1 is a schematic illustration of an example neural network (NN) trainer 102 to train example BNN 104. The example BNN 104 includes an example reference clock 106, an example memory 108, and example neurons 110. Although the illustrated neurons 110 of FIG. 1 include six neurons, there may be any number of neurons in any type of configuration. Although the example of FIG. 1 is described in conjunction with the BNN 104, examples disclosed herein may be utilized in any AI-based system or model that includes weights.

The example NN trainer 102 of FIG. 1 trains the BNN 104 by selecting a mean weight and an amount of deviation for the mean weight for each of the neurons 110. Initially, the BNN 104 is untrained (e.g., the neurons are not yet weighted with a mean and deviation). To train the BNN 104, the example NN trainer 102 of FIG. 1 uses training data (e.g., input data labelled with known classifications and/or outputs) to configure the BNN 104 to be able to predict output classifications for input data with unknown classification. The NN trainer 102 may train a model with a first set of training data and test the model with a second set of the training data. If, based on the results of the testing, the accuracy of the model is below a threshold, the NN trainer 102 can tune (e.g., adjust, further train, etc.) the parameters of the model using additional sets of the training data and continue testing until the accuracy is above the threshold. After the NN trainer 102 has trained the BNN 104, the example NN trainer 102 stores the corresponding means and deviations for the respective neurons 110 in the example memory 108 of the example BNN 104. The example NN trainer 102 may be implemented in the same device as the BNN 104 and/or in a separate device in communication with the example BNN 104. For example, the NN trainer 102 may be located remotely, develop the weight data locally, and deploy the weight data (e.g., means and deviation for the respective neurons 110) to the BNN 104 for implementation.

The example BNN 104 of FIG. 1 includes the example reference clock 106. The reference clock 106 generates a periodic signal (e.g., a clock signal, a pulse signal, etc.). The periodic signal can be used by one or more of the example neurons 110 to sample a voltage of a jittery oscillator to infuse randomness into a weight generated by the respective neuron 110, as further described below.

The example BNN 104 of FIG. 1 further includes the example memory 108. The example memory 108 stores the weight data from the example NN trainer 102 in conjunction with a particular neuron. For example, a first section of the memory 108 is dedicated for a first mean value and a first variance value for a first neuron, a second section of the memory 108 is dedicated to a second mean value and a second variance value for a second neuron, etc. The mean value may be stored in the dedicated section as a bit value representative of the mean value. As further described below, the bit value corresponds to control of particular switches in a C-2C ladder of one the neurons 110 (e.g., each bit value corresponding to one or more switches in a single bit cell). In this manner, the bit value controls the bit cells of the C-2C ladder to ensure that the output voltage is equivalent to the mean value. The variance value is used to control a variable resistor to adjust the slope of the clock signal from the reference clock 106. Because the reference clock 106 is sampled based on a rising edge of a jitter clock signal from a jittery oscillator, adjusting the slope of the clock signal adjusts the variance, as further described below.

The example neurons 110 of FIG. 1 receive input data, generate a weight that corresponds to a probability distribution and apply the weight to the input data to generate an output. For example, if the probability distribution of a neuron follows a standard normal distribution, the mean weight of the neuron is 0.7, and the variance of the neuron is 0.01 (e.g., the standard deviation is 0.1), then the will be a 68% chance that the neuron will output a weight between 0.6 and 0.8 (e.g., one standard deviation away from the mean), a 95% chance that the neuron will output a weight between 0.5 and 0.9 (e.g., two standard deviations away from the mean), etc. Accordingly, the weight generated by the output may be different every time a weight is generated but will follow the probability distribution. Thus, the example neurons 110 provide randomness that can counteract overfitting and sensitivity to malicious attacks. The structure of one of the example neurons 110 is further described below in conjunction with FIGS. 2 and 3.

Figure 2:
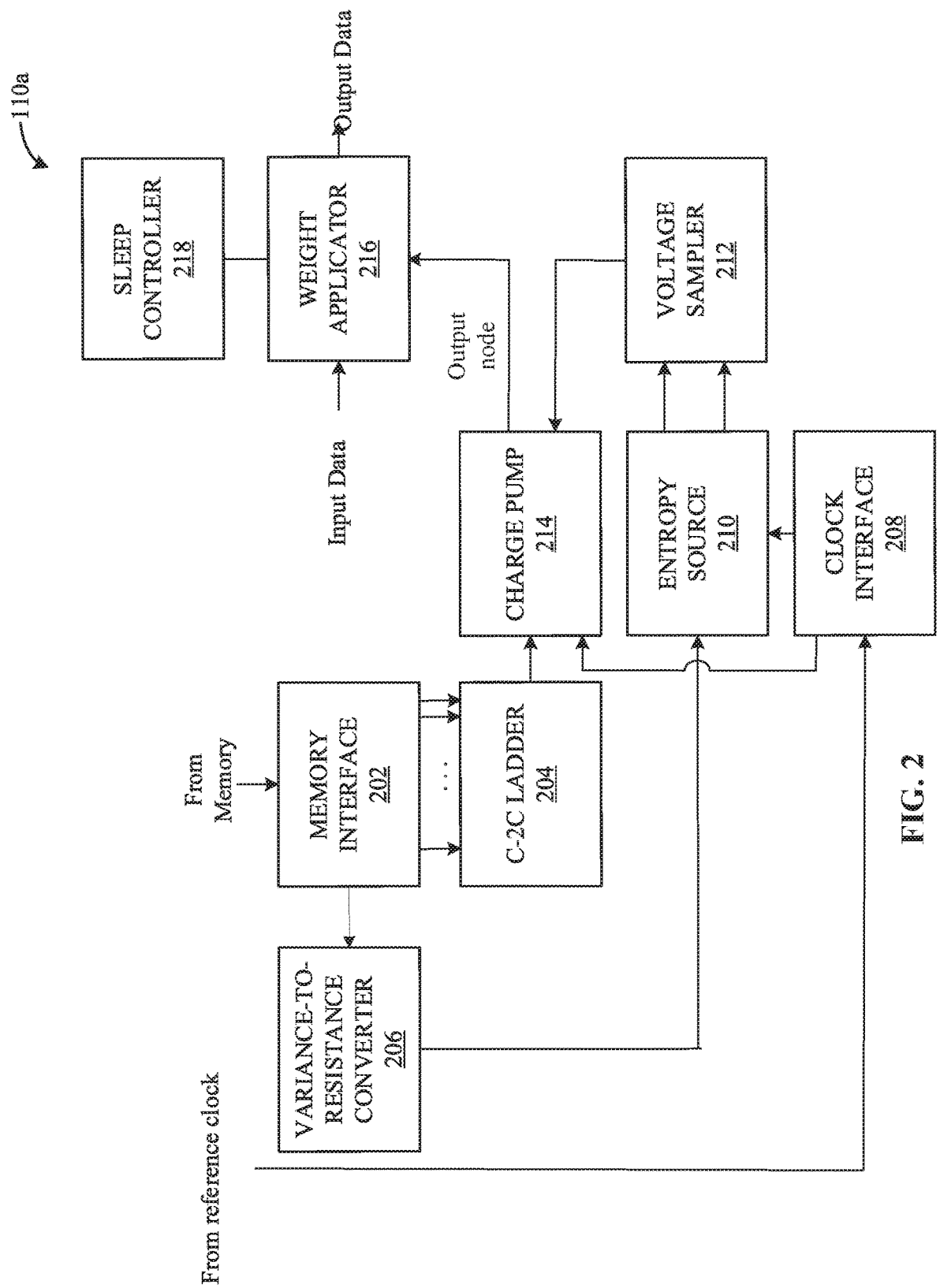
FIG. 2 is a block diagram of an example neuron of the Bayesian neural network of FIG. 1

FIG. 2 is a block diagram of one of the example neurons 110 of FIG. 1. The example neuron 110 includes an example memory interface 202, an example C-2C ladder 204, an example variance to resistance converter 206, an example clock interface 208, an example entropy source 210, an example voltage sampler 212, an example charge pump 214, an example weight applicator 216, and an example sleep controller 218.

The example memory interface 202 of FIG. 2 interfaces with the example memory 108 of FIG. 1 to access the bit value of the mean and the variance corresponding to the neuron 110. The memory interface 202 transmits the bit value representative of the mean for the output weight to the example C-2C ladder 204 (e.g., with a line for each bit). For example, if the mean is represented by an 8-bit value, the memory interface 202 transmits eight signals so the C-2C ladder (e.g., in series or in parallel), one signal for each bit of the 8-bit mean value. The memory interface 202 transmits the variance to the example variance-to-resistance converter 206.

The example C-2C ladder 204 of FIG. 2 obtains the bit values corresponding to the mean weight value (also referred to as mean value or mean weight) from the example memory interface 202 and generates a voltage corresponding to the mean weight. For example, the C-2C ladder may include X bit cells corresponding to the X bit values of the mean. The C-2C bit cells include capacitors to store charge and switches to discharge and/or charge the capacitor (e.g., by grounding and/or apply a voltage supply to the capacitors). By controlling the switches, one or more of the bit cells can charge and/or discharge to generate an output voltage that corresponds to the mean value. For example, if the switches of all the bit cells are enabled to allow the supply voltage to charge the respective capacitors, the output voltage will be equivalent to 1 (e.g., 100% of the supply voltage), if the switches of half the bit cells are enabled and the switches of half the bit cells are disabled, the output voltage will be equivalent to 0.5 (e.g., 50% of the supply voltage), etc. A hardware implementation of the C-2C ladder 204 is further described below in conjunction with FIG. 2. The example C-2C ladder 204 outputs the voltage corresponding to the mean value to the example charge pump 214.

The example variance-to-resistance converter 206 of FIG. 2 obtains the variance value stored in the memory 108 via the example memory interface 202 and converts the variance into a resistance value. The example variance-to-resistance converter 206 converts the resistance into a signal (e.g., a voltage) that is used to adjust the resistance of a resistive element (e.g., a variable resistor) of the entropy source 210. The variance-to-resistance converter 206 may be implemented by one or more multiplexers and/or look up tables that convert a variance value to a signal representative of a resistance to tune a variable resistor to the corresponding resistance. In this manner, the variable resistor of the entropy source 210 can adjust the resistance to adjust the slope a jitter free reference clock signal corresponding to an amount of variance when being sampled based on a raising edge of a jittery clock signal from a jittery oscillator, as further described below.

The example clock interface 208 of FIG. 2 interfaces with the example reference clock 106 of FIG. 1 to obtain the periodic signal (e.g., a jitter free referenced clock signal) from the reference clock 106. The example clock interface 208 passes the clock signal from the reference clock 106 to a buffer of the example entropy source 210.

The example entropy source 210 of FIG. 2 obtains the clock signal from the clock interface 208 and the signal corresponding to a resistance from the variance-to-resistance converter 206. The example entropy source 210 includes a buffer to delay the rising edge of the clock signal. The buffer includes a variable resistor that is controlled (e.g., to adjust the resistance) based on the signal from the variance-to-resistance converter 206. In this manner, the example entropy source 210 adjusts the slope of the rising edge of the clock signal based on the signal from the variance-to-resistance converter 206. The example entropy source 210 outputs the buffered clock signal to the example voltage sampler 212. Additionally, the entropy source 210 includes a jittery oscillator that generates a clock signal that includes some amount of jitter. The jitter of the oscillator is leveraged to create an amount of randomness that is added to the mean value to generate a weight that corresponds to a probability distribution. For example, the rising edge of the clock signal generated by the jittery oscillator may be slightly different (e.g., with respect to when the rising edge occurs) based on the intrinsic characteristics of the analog components of the oscillator. As further described below, the voltage sampler 212 samples the voltage output by the jitter free output of the buffered reference clock signal based on the raising edge of the jittery output voltage of the jittery oscillator. An example hardware implementation of the entropy source 210 is further described below in conjunction with FIG. 3.

The example voltage sampler 212 of FIG. 2 samples the voltage output by the buffer of the example entropy source 210 when the jittery clock signal reaches a threshold voltage. The example voltage sampler 212 outputs the sampled voltage until a subsequent sample is obtained. The example voltage sampler 212 may be implemented by one or more comparators and/or one or more latches. Because of the jitter of the jittery oscillator, the example voltage sampler 212 may sample different voltages for each sample that corresponds to a probability distribution. The slope of the buffered clock signal (e.g., based on the resistance of the variable resistor) results in the amount of variance to add to the output voltage of the example C-2C ladder 204. The example voltage sampler 212 outputs the sampled voltage to the example charge pump 214 of FIG. 4.

The example charge pump 214 of FIG. 2 adjusts the weight output (e.g., a voltage that corresponds to the determined mean) by the C-2C ladder by adjusting the weight output voltage during two adjacent clock cycles (e.g., two rising edges of a clock signal) to discharge and charge the weight output voltage at the output node of the charge pump 214, thereby generating an adjusted weight that can be applied to input data. For example, the charge pump 214 may discharge the output of the C-2C ladder 204 using a first sampled voltage from the voltage sampler 212 during a first cycle (e.g., corresponding to the clock signal from the reference clock 106) and charge the output of the C-2C ladder 204 using a second sampled voltage from the voltage sampler 212 during a second subsequent cycle. The resulting voltage output by the charge pump 214 will be the mean value plus the difference between the sampled voltage at the first cycle and the sampled voltage at the second cycle. Thus, the resulting voltage output after the first and second cycles (e.g., corresponding to one discharge and one charge) corresponds to some voltage along the probability distribution about the mean based on the variance caused by the jitter oscillator of the entropy source 210. In some examples, the charge pump 214 uses the first cycle to charge the voltage at the output node and uses the second cycle to discharge the voltage at the output node to generate the adjusted weight. The charge pump 214 outputs the resulting adjusted weight (e.g., the mean value plus or minus the variance (e.g., the difference between the first sampled voltage and the second subsequent sampled voltage)) to the example weight applicator 216.

The example weight applicator 216 of FIG. 2 receives input data (e.g., image data, video data, audio data, files, word docs, applications, code, etc.) and applies the generated weight (e.g., output by the charge pump 214) to the input data to generate output data. For example, the weight applicator 216 may multiply the input data by the generated weight. In some examples, the charge pump 214 may generate multiple weights to be applied to the input data.

The example sleep controller 218 monitors when data is input into the example weight applicator 216 to implement a sleep/wake protocol. For example, after the weight applicator 216 outputs the output data, the example sleep controller 218 may control one or more components of the neuron 110 to cause the one or more components to power down and/or enter into a sleep or low power mode (e.g., to conserve power). When new input data is received at the weight applicator 216, the example sleep controller 218 sends a signal to the one or more components of the neuron 110 to wake up and/or exit from the sleep and/or low power mode. In some examples, the sleep controller 218 can control components of the neuron 110 to operate in different modes. For example, the sleep controller 218 may power down or disconnect the entropy source 210 and/or the charge pump 214. In such an example, the neuron 110 can operate like a traditional neural network where the C-2C ladder 204 generates a constant output weight (e.g., that is not adjusted).

Figure 3:
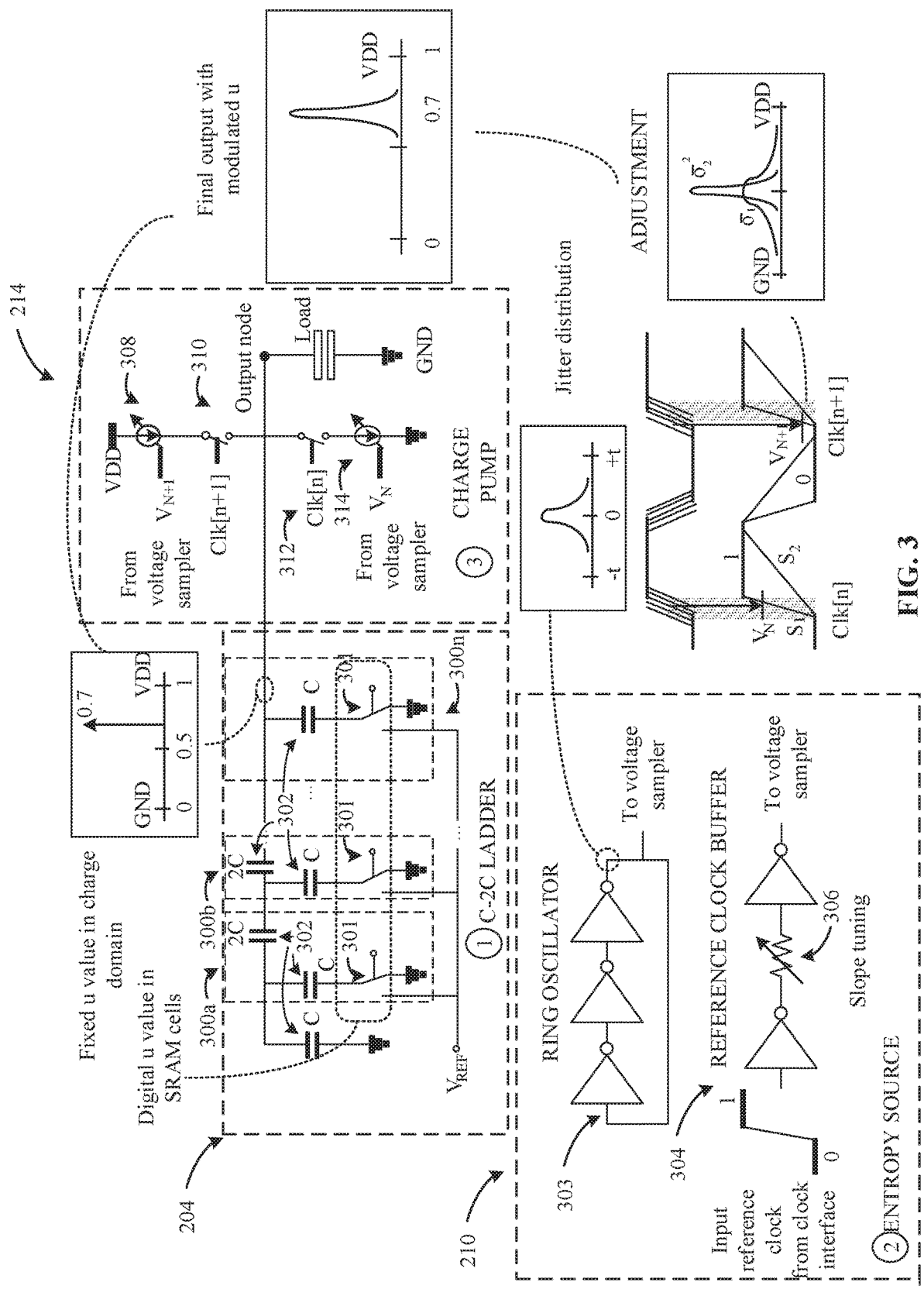
FIG. 3 is a hardware implementation of an example C-2C ladder, an example entropy source, and a charge pump of the neuron of FIG. 2.

FIG. 3 illustrates a hardware implementation of the example C-2C ladder 204, the example entropy source 210 and the example charge pump 214 of FIG. 2. The example C-2C ladder 204 includes example bit cells 300$a$-$n$, example switches 301, and example capacitors 302, the example entropy source 210 includes an example ring oscillator 303, an example reference clock buffer 304, and an example variable resistor 306. The example charge pump 214 includes an example charge-side variable current source 308, example switches 310, 312, and an example discharge-side variable current source 314.

The example C-2C ladder 204 of FIG. 3 includes X bit cells 300$a$-$n$ for the X bits of the mu value (e.g., the mean value of the weight). Each bit cell 300$a$-$n$ includes the switch(es) 301 that can be controlled to charge the respective capacitor 302 and/or discharge the respective capacitor 302. As described above, the bit values of mu are used to control the switches 301. For example, if a bit value of mu corresponds to 0, 1, 1, 0, then the first switch and the last switch will be controlled to operate a first state (e.g., to ground) and the middle switches will be controlled to operate a second state (e.g., the reference voltage Vref). The sum of the charges stored at the example bit cells 300$a$-$n$ corresponds to the output voltage that corresponds to mu (e.g., 0.7 in the illustrated example of FIG. 3). In some examples, each switch 301 may be implemented by four transistors, as further shown below in conjunction with FIG. 4. Accordingly, the example C-2C ladder 204 can be implemented with 3*X capacitors and 4*X capacitors, where X is the number of bits to represent mu.

The example entropy source 210 of FIG. 1 includes the example ring oscillator 303. The example ring oscillator 303 includes three inventors (e.g., analog components). However, the ring oscillator 303 can be implemented with any odd number of stages. The ring oscillator 303 is a jittery oscillator. Thus, the rising edge of the ring oscillator 303 may not occur at the same time within a cycle as other cycles. The distribution of the jitter corresponds a probability distribution. Accordingly, the jitter of the ring oscillator 303 can be leveraged to add randomness to the output voltage of the C-2C ladder 204 via the charge pump 214. The example entropy source 210 further includes the example reference clock buffer 304. The reference clock buffer 304 obtains the input reference clock from the clock interface 208 of FIG. 2. The reference block buffer delays the clock signal by some time t and adjusts the slope of the rising edge of the clock using the example variable resistor 306. Although the example of FIG. 3 includes the variable resistor 306, the variable resistor 306 can be replaced with any type of resistive element (e.g., a transistor with a tuned gate voltage). The higher the resistance of the example variable resistor 306, the slower the slope of the clock signal output by the reference clock buffer 304 and the lower the resistance of the example variable resistor 306, the faster the slope of the clock signal output by the reference clock buffer 304. As described above, the example variance-to-resistance converter 206 outputs a signal to the example variable resistor 306 to adjust the resistance so that the probability distribution for a sampled voltage corresponds to the target variance stored in the example memory 108 of FIG. 1. Although the example entropy source 210 includes a buffer to adjust a clock signal and a jittery oscillator, the example entropy source 210 may include two jittery oscillators (e.g., a first oscillator to compare to a threshold and a second oscillator to sample when the voltage of the first oscillator satisfies the threshold). However, in such examples, to program the output of such an entropy source 210 to correspond to a desired probability distribution, additional hardware and/or operation overhead may be needed to achieve the desired probability distribution.

As described above, the example voltage sampler 212 of FIG. 2 obtains the jittery output clock signal of the example ring oscillator 303 and the jitter free output buffered clock signal from the example reference clock buffer 304. The example voltage sampler 212 monitors the voltage of the jittery output of the example ring oscillator 303 until the voltage rises above a threshold voltage (e.g., during the rising edge). When the voltage sampler 212 determines that the jittery output voltage of the ring oscillator 303 is above a threshold, the voltage sampler 212 samples the voltage of jitter free buffered output voltage of the reference clock buffer 304 and outputs the sampled voltage. Because of the jitter of the ring oscillator 303, the point of time when the output voltage of the ring oscillator 303 will be above the threshold may vary with respect to difference cycles. Accordingly, the sampled voltage with likewise vary, thereby corresponding to the randomness to be added to the weight generated by the example C-2C ladder 204. In some examples, the voltage sampler 212 uses a falling edge instead of a rising edge to trigger sampling (e.g., when the voltage is below a threshold voltage, trigger sampling). In some examples, the voltage sampler 212 may monitor the jitter free output voltage of the reference clock buffer 304, sample the jittery output voltage of the ring oscillator 303 when the jitter free voltage reaches a threshold voltage, and output the sampled voltage to the charge pump 214.

The example charge pump 214 of FIG. 3 is a phase-locked loop (PLL) charge pump. However, the charge pump 214 can be any type of charge pump. The charge pump 214 increases or decreases the output voltage of C-2C ladder 204 based on a difference between two samples (e.g., of two neighboring cycles) from the example voltage sampler 212. The charge pump 214 includes a first example switch(es) 312 that is enabled for a first duration of time (e.g. Clk[n], based on the clock signal from the reference clock 106 of FIG. 1) after the voltage sampler 212 outputs a first sampled voltage to the variable current source 314. The variable current source 314 pumps current toward ground to discharge the charge at the output of the C-2C ladder 204, thereby decreasing the voltage at the output of the C-2C ladder 204. The amount of current pumped out (e.g., corresponding to the amount of voltage decrease at the output of the C-2C ladder 204) depends on the first sampled voltage, which controls the variable current source 314.

During a subsequent cycle, the voltage second example switch(es) 310 is enabled for a second duration of time (e.g., Clk [n+1]) after the voltage sampler outputs a second sampled voltage to the variable current source 308. The variable current source 308 pumps current into the output node of the C-2C ladder 204 to charge the output of the C-2C ladder 204, thereby increasing the voltage at the output of the C-2C ladder 204. The amount of current pumped in depends on the depends on the second sampled voltage, which controls the variable current source 308. Accordingly, after the two cycles, the charge pump decreases and then increases the voltage output by the example C-2C ladder 204. Thus, the output of the charge pump 214 corresponds to the mean weight value plus the difference corresponding to the first voltage sample and the second voltage sample. The combination of the entropy source 210 and the charge pump 214 can be implemented with 50 transistors and 12 resistors. An example timing diagram that further describes the functionality of the entropy source 210 and the charge pump 214 is further described below in conjunction with FIG. 6.

Figure 4:
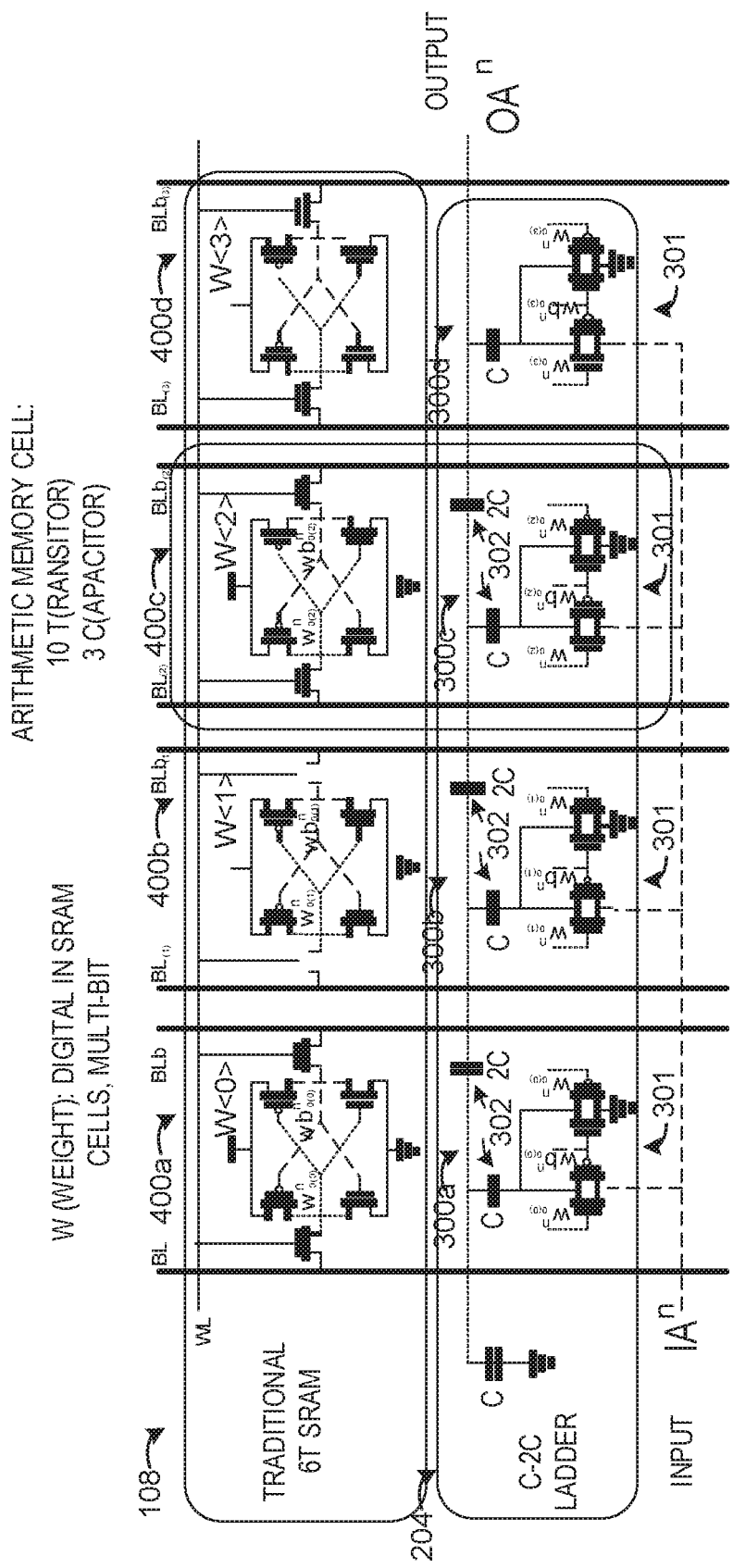
FIG. 4 is a hardware implementation of an example C-2C ladder of FIG. 2 and a section of example memory of FIG. 1.

FIG. 4 illustrates an example hardware implementation of a section of the example memory 108 that stores a bit-wise value of mu and the corresponding bit cells 300a-d of the example C-2C ladder 204. As described above, operation of the bit cells 300a-d generate an output voltage corresponding to the stored value of mu. The example section of the memory 108 includes example four 6 transistors (6T) storage cells 400a-d corresponding to the four bit cells 300a-d. Although the illustrated example of FIG. 4 includes four bit cells 300a-d and four 6T storage cells 400a-d (e.g., corresponding to a 4 bit mu value), FIG. 4 may include any number of bit cells and/or 6T storage cells corresponding to any number of bits to represent mu. As shown in FIG. 4, to implement and X bit value of mu, 10*X transistors (6 transistors to implement the 6T SRAM cell plus 4 transistors to implement the switches 301 in a bit cell 300a-d) where X is the number of bits to represent mu, and 3*X capacitance (e.g., a first capacitor with a first capacitance and a second capacitor with twice the first capacitance, per cell) can be used.

While an example manner of implementing the BNN 104 of FIG. 1 is illustrated in FIGS. 1-4, one or more of the elements, processes and/or devices illustrated in FIGS. 1-4 may be combined, divided, re-arranged, omitted, eliminated and/or implemented in any other way. Further, the example reference clock 106, the example memory 108, the example memory interface 202, the example variance-to-resistance converter 206, the example clock interface 208, the example entropy source 210, the example voltage sampler 212, the example charge pump 214, the example weight applicator 216, the example sleep controller 218, and/or, more generally, the example BNN 104 of FIGS. 1-3 may be implemented by hardware, software, firmware and/or any combination of hardware, software and/or firmware. Thus, for example, any of the example reference clock 106, the example memory 108, the example memory interface 202, the example variance-to-resistance converter 206, the example clock interface 208, the example entropy source 210, the example voltage sampler 212, the example charge pump 214, the example weight applicator 216, the example sleep controller 218, and/or, more generally, the example BNN 104 of FIGS. 1-3 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example reference clock 106, the example memory 108, the example memory interface 202, the example variance-to-resistance converter 206, the example clock interface 208, the example entropy source 210, the example voltage sampler 212, the example charge pump 214, the example weight applicator 216, the example sleep controller 218, and/or, more generally, the example BNN 104 of FIGS. 1-3 is/are hereby expressly defined to include a non-transitory computer readable storage device or storage disk such as a memory, a digital versatile disk (DVD), a compact disk (CD), a Blu-ray disk, etc. including the software and/or firmware. Further still, the example BNN 104 of FIGS. 1-3 may include one or more elements, processes and/or devices in addition to, or instead of, those illustrated in FIGS. 1-3, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 5A:
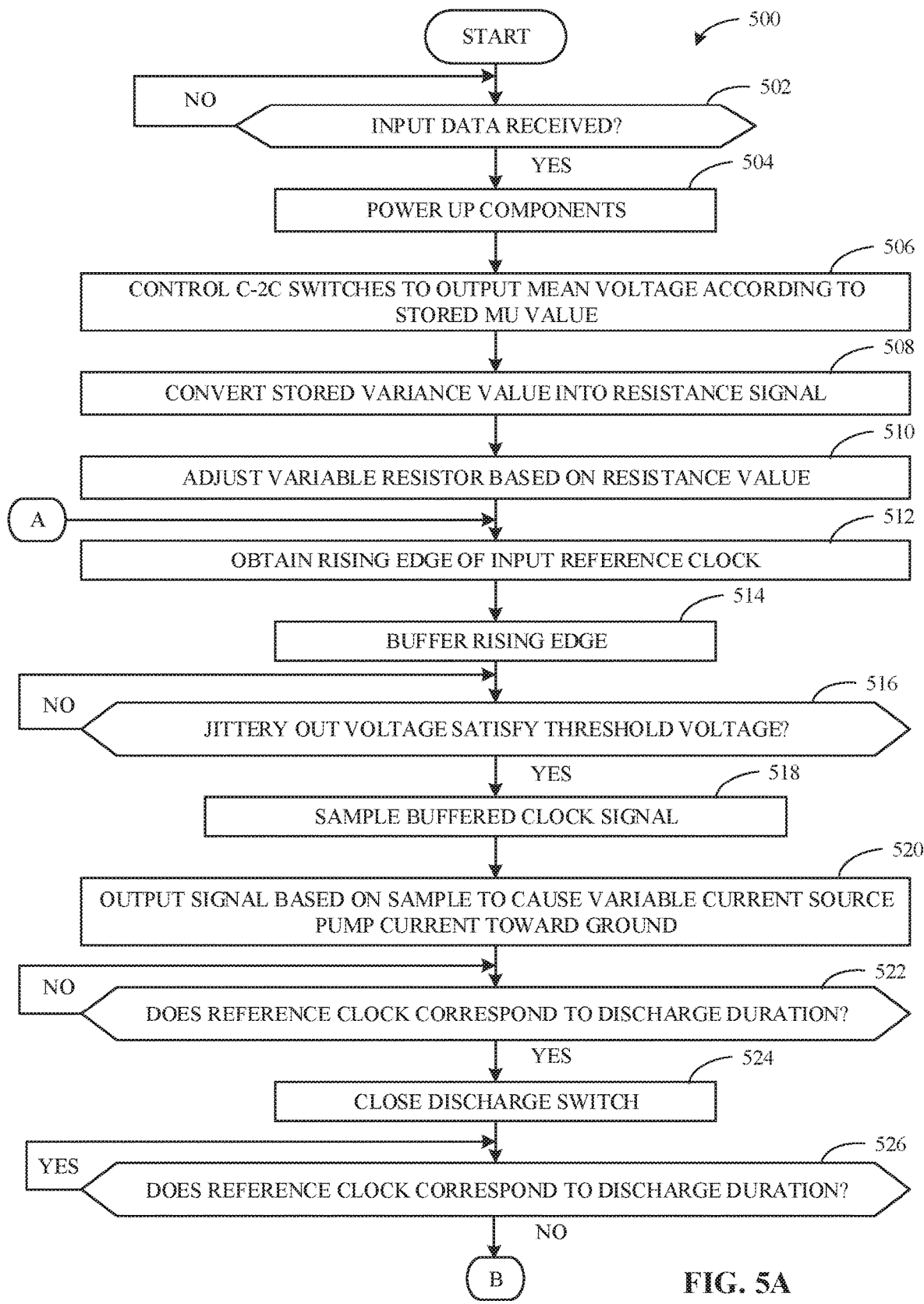
FIGS. 5A and 5B illustrate a flowchart representative of example machine readable instructions which may be executed to implement the example neuron of FIGS. 1, 2, and/or 3.
Figure 5B:
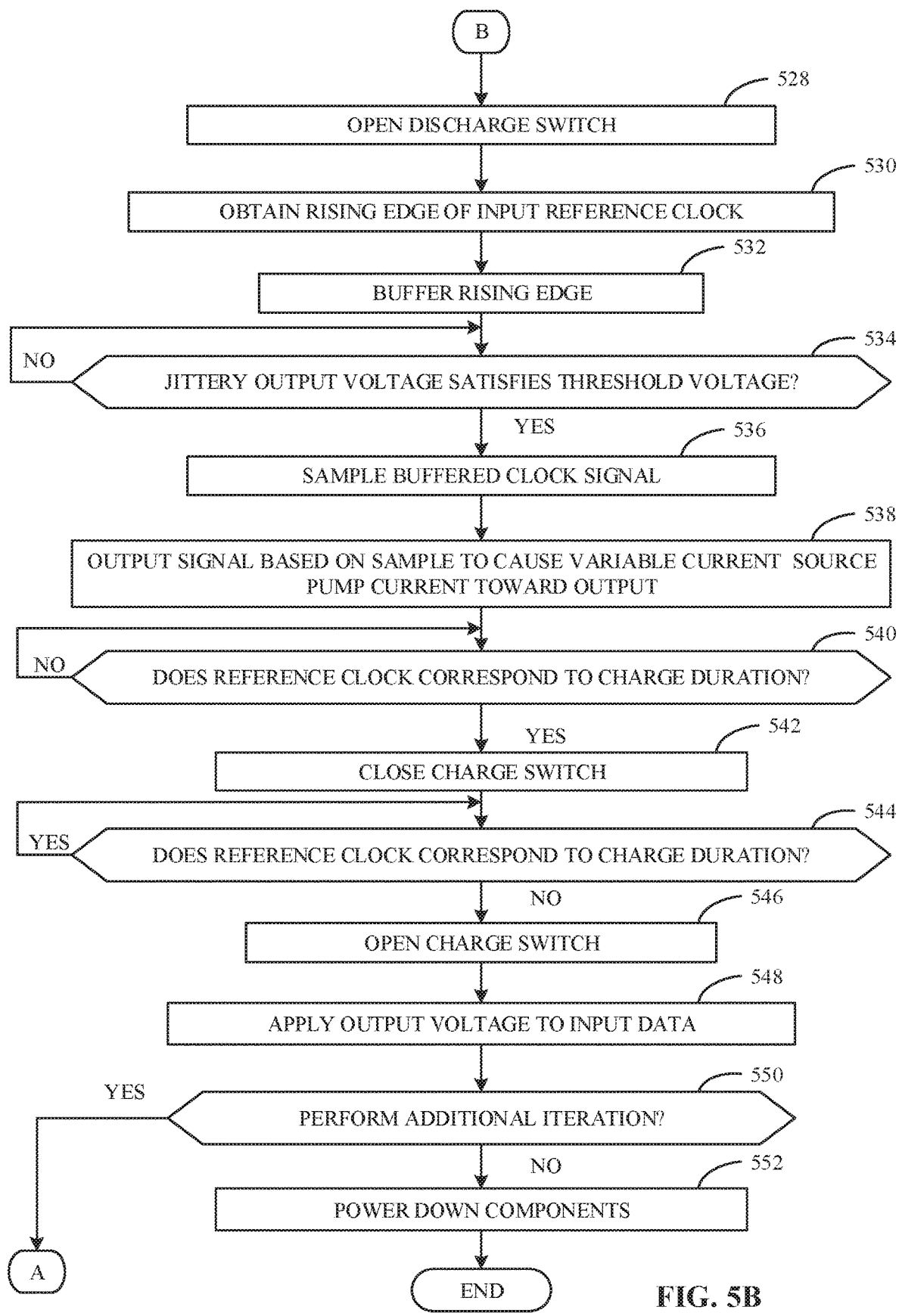

Flowcharts representative of example hardware logic, machine readable instructions, hardware implemented state machines, and/or any combination thereof for implementing the example BNN 104 of FIGS. 1-3 are shown in FIGS. 5A-5B. The machine readable instructions may be one or more executable programs or portion(s) of an executable program for execution by a computer processor such as the processor 712 shown in the example processor platform 700 discussed below in connection with FIG. 7. The program may be embodied in software stored on a non-transitory computer readable storage medium such as a CD-ROM, a floppy disk, a hard drive, a DVD, a Blu-ray disk, or a memory associated with the processor 712, but the entire program and/or parts thereof could alternatively be executed by a device other than the processor 712 and/or embodied in firmware or dedicated hardware. Further, although the example program is described with reference to the flowcharts illustrated in FIGS. 5A-5B, many other methods of implementing the example BNN 104 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 5-6 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIGS. 5A and 5B is a flowchart representative of example machine readable instructions 500 which may be executed to implement the neuron 110 of FIGS. 1-3 of a BNN generate a weight corresponding to a probability distribution to apply to input data. Although the instructions 500 are described in conjunction with the example neurons 110 of FIGS. 1-3, the instructions 500 may be described in conjunction with any neuron in any type of neural network that includes a weight generator, an entropy source, and a charge pump.

At block 502, the example sleep controller 218 determines if input data was received at the weight applicator 216. As described above, the sleep controller 218 monitors the weight applicator 216 to determine when input data is received to wake up component(s), power up component(s), and/or exit a low power mode of component(s) of the example neuron 110. If the example sleep controller 218 determines that input data is not received (block 502: NO), instructions return to block 502 until input data is received (e.g., the component(s) of the neuron 110 remain asleep, off, and/or in low power mode). If the example sleep controller 218 determines that input data is received (block 502: YES), the example sleep controller 218 powers up (e.g., wakens and/or instructs to exit low power mode) one or more components of the neuron 110 that are asleep, off, or in low power mode (block 504).

At block 506, the example memory interface 202 accesses the bit values from the example memory 108 to control the C-2C switches 301 based on the values of stored in the memory 108 to output the mean voltage according to the stored mu value. At block 508, the example variance-to-resistance converter 206 converts the variance value stored in the example memory 108 into a signal corresponding to a resistance value. As described above, the resistance signal is used to adjust the resistance of the variable resistor 306 or other resistive element of the example reference clock buffer 304. As described above, adjusting the resistance adjusts the edge of the rising slope of the clock signal, thereby adjusting the probability distribution corresponding to the ring oscillator 303 to correspond to the stored variance value.

At block 510, the example variance-to-resistance converter 206 outputs a signal that is applied to the variable resistor 306 to adjust the variable resistance of the variable resistor 306 to a particular resistance (e.g., defined by the output of the variance-to-resistance converter 206 and corresponding to the stored variance). At block 512, the example reference clock buffer 304 of the example entropy source 210 obtains a clock signal from the reference clock 106 (e.g., via the clock interface 208). At block 514, the example reference clock buffer 304 of the entropy source 210 buffers the jitter free reference clock signal (e.g., using an even number of inverters). Additionally, the example reference clock buffer 304 adjusts the slope of the rising edge of the jitter free reference clock signal (e.g., using the example variable resistor 306).

At block 516, the example voltage sampler 212 determines if the jittery output voltage from the ring oscillator 303 of the entropy source 210 satisfies a voltage (e.g., is above a voltage when monitoring a rising edge or is below a voltage when monitoring a falling edge). The voltage sampler 212 samples the jitter free output of the reference clock buffer 304 when the voltage of jittery output clock signal from the ring oscillator 303 satisfies the threshold. Alternatively, the voltage sampler 212 samples the jittery output of the ring oscillator 303 when the voltage of jitter free reference clock signal from the reference clock buffer 304 satisfies the threshold. If the example voltage sampler 212 determines that the jittery output voltage of the ring oscillator 303 does not satisfy the threshold voltage (block 516: NO), control returns to block 516 until the jittery output voltage satisfies the threshold voltage.

If the example voltage sampler 212 determines that the jittery output voltage of the ring oscillator 303 satisfies the threshold voltage (block 516: YES), the example voltage sampler 212 samples the output voltage of the reference clock buffer 304 (e.g., the buffered clock signal) (block 518). At block 520, the example voltage sampler 212 outputs a signal based on the sample to the variable current source 314 to pump current toward ground. At block 522, the example switch 312 of the example charge pump 214 determines (e.g., based on the jitter free reference clock signal which controls the switch 312) if the reference clock corresponds to a discharge duration (e.g., Clk[n] of FIG. 3). The discharge duration can correspond to the high duration of the clock signal or the low duration of the clock signal for the first cycle.

If the example switch 312 determines that the reference clock signal does not correspond to the discharge duration (block 522: NO), control returns to block 522 until the reference clock signal corresponds to the discharge duration. If the example switch 312 determines that the reference clock signal corresponds to the discharge duration (block 522: YES), the example switch 312 (e.g., the switch at the discharging portion of the charge pump 214) closes (e.g., enables) (block 524). Enabling the switch 312 while the variable current source pumps current toward ground causes the charge at the output of the C-2C ladder 204 to discharge, thereby decreasing the output voltage at the output of the C-2C ladder 204.

At block 526 the example switch 312 of the example charge pump 214 determines (e.g., based on the reference clock signal which controls the switch 312) if the reference clock still corresponds to a discharge duration (e.g., Clk[n] of FIG. 3). If the example switch 312 determines that the reference clock still corresponds to the discharge duration (block 526: YES), control returns to block 526 until the reference clock no longer corresponds to the discharge duration. If the example switch 312 determines that the reference clock no longer corresponds to the discharge duration (block 526: NO), the example switch 312 (e.g., at the discharging portion of the charge pump 214) opens (e.g., disables) (block 528), thereby stopping the discharging at the output node of the example C-2C ladder 204.

At block 530, the example reference clock buffer 304 of the example entropy source 210 obtains a clock signal from the reference clock 106 (e.g., via the clock interface 208). At block 532, the example reference clock buffer 304 of the entropy source 210 buffers the reference clock signal (e.g., using an even number of inverters). Additionally, the example reference clock buffer 304 adjusts the slope of the rising edge of the reference clock signal (e.g., using the example variable resistor 306).

At block 534, the example voltage sampler 212 determines if the jittery output voltage from the ring oscillator 303 of the entropy source 210 satisfies a voltage (e.g., is above a voltage when monitoring a rising edge or is below a voltage when monitoring a falling edge). The voltage sampler 212 samples the jitter free output of the reference clock buffer 304 when the voltage of jittery clock signal from the ring oscillator 303 satisfies the threshold. Alternatively, the voltage sampler 212 may sample the jittery block signal of the ring oscillator 303 when the voltage of jitter free clock signal from the reference clock buffer 304 satisfies the threshold. If the example voltage sampler 212 determines that the jittery output voltage of the ring oscillator 303 does not satisfy the threshold voltage (block 534: NO), control returns to block 534 until the jittery output voltage satisfies the threshold voltage.

If the example voltage sampler 212 determines that the jittery output voltage of the ring oscillator 303 satisfies the threshold voltage (block 534: YES), the example voltage sampler 212 samples the output voltage of the reference clock buffer 304 (e.g., the buffered clock signal) (block 536). At block 538, the example voltage sampler 212 outputs a signal based on the sample to the variable current source 308 to pump current toward the output of the example C-2C ladder 204. At block 540, the example switch 310 of the example charge pump 214 determines (e.g., based on the reference clock signal which controls the switch 310) if the reference clock corresponds to a charge duration (e.g., Clk[n+1] of FIG. 3). The charging duration can correspond to the high duration of the clock signal or the low duration of the clock signal for the second cycle.

If the example switch 310 determines that the reference clock signal does not correspond to the charge duration (block 540: NO), control returns to block 522 until the reference clock signal corresponds to the charge duration. If the example switch 310 determines that the reference clock signal corresponds to the charge duration (block 540: YES), the example switch 312 (e.g., the switch at the charging portion of the charge pump 214) closes (e.g., enables) (block 542). Enabling the switch 310 while the variable current source pumps current toward the output node causes the charge at the output of the C-2C ladder 204 to increase, thereby increasing the output voltage at the output of the C-2C ladder 204.

At block 544, the example switch 310 of the example charge pump 214 determines (e.g., based on the reference clock signal which controls the switch 310) if the reference clock still corresponds to a charge duration (e.g., Clk[n+1] of FIG. 3). If the example switch 310 determines that the reference clock still corresponds to the charge duration (block 544: YES), control returns to block 526 until the reference clock no longer corresponds to the charge duration. If the example switch 310 determines that the reference clock no longer corresponds to the charge duration (block 544: NO), the example switch 310 opens (e.g., disables) (block 546), thereby stopping the charging at the output of the example C-2C ladder 204. As described above, the charge pump 214 discharges and then charges the charge at the output of the C-2C ladder 204 so that the output voltage corresponds to the mean value plus some voltage that corresponds to the difference between the first sampled voltage and the second sampled voltage, thereby adding some randomness based on the probability distribution of the jitter of the ring oscillator 303. At block 548, the example weight applicator 216 applies (e.g., multiple) the adjusted weight output at the output node to the input data to generate the output data.

At block 550, the example sleep controller 218 determines if an additional iteration is to be performed (e.g., for an additional weight generation corresponding to the same and/or additional input data). If the example sleep controller 218 determines that an additional iteration is to be performed (block 550: YES), control returns to block 512. If the example sleep controller 218 determines that an additional iteration is not to be performed (block 550: NO), the example sleep controller 218 powers down one or more of the components of the neuron 110 (block 552).

Figure 6:
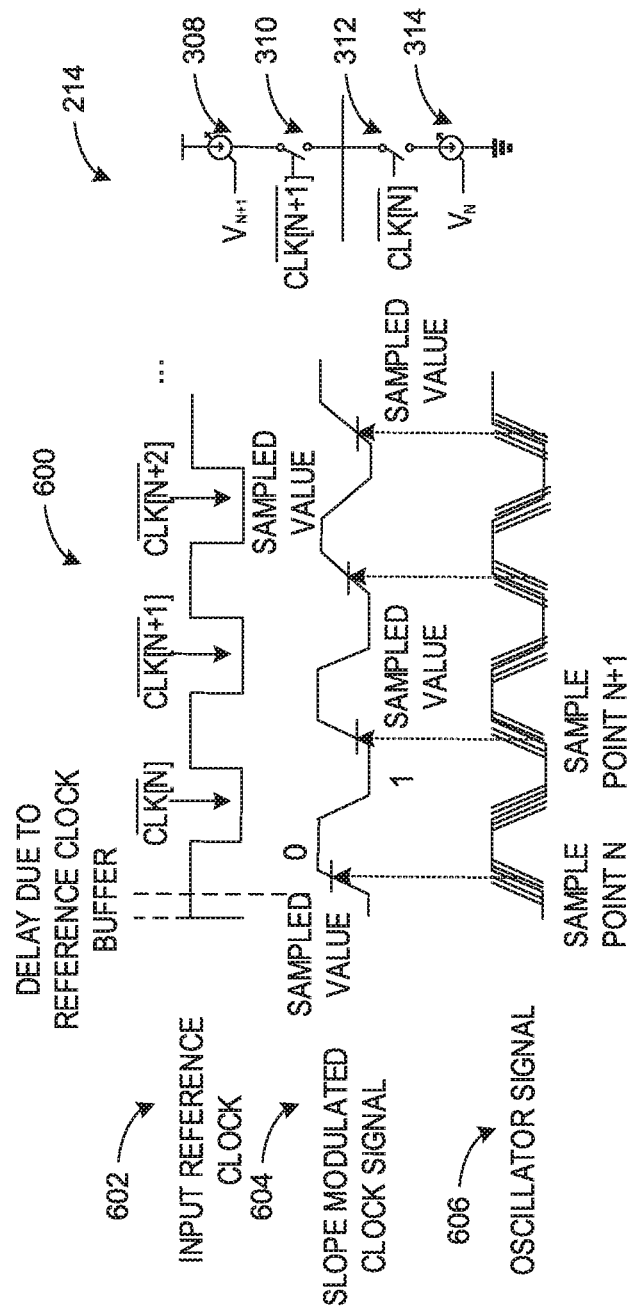
FIG. 6 is a timing diagram corresponding to signals with respect to the example entropy source of FIG. 3.

FIG. 6 illustrates an example timing diagram 600 of an example input clock reference clock signal 602 (e.g., output by the example reference clock 106 of FIG. 1), an example modulated clock signal 604 (e.g., output by the example reference clock buffer 304 of FIG. 3), and an example jittery signal 606 (e.g., output by the example oscillator 303 of FIG. 3). FIG. 6 further includes the example charge pump 214 of FIG. 3 for illustrative purposes.

As shown in the example modulated signal 604 of FIG. 6 (e.g., modulated with respect to time and the slope of the raising/falling edge), the signal is delayed (e.g., due to the inventors of the reference clock buffer 304) and has a slower slope due to the variable resistor 306 of FIG. 3. Additionally, the example jittery signal 606 illustrates the jitter produced by the example ring oscillator 303. Accordingly, when the jittery signal 606 reaches a threshold voltage during the first cycle, the example voltage sampler 212 samples the voltage at the modulated/buffered signal 604 (e.g., Vn) and outputs the first sampled voltage (Vn) to the example current source Vn 314 to pump current to ground when the switch 312 is enabled (e.g., during the duration corresponding to Clk[n] of the input reference clock signal 602). When the jittery signal 606 reaches a threshold voltage during the second cycle, the example voltage sampler 212 samples the voltage at the modulated/buffered signal 604 (e.g., Vn+1) and outputs the first sampled voltage (Vn+1) to the example current source Vn 308 to pump current to the output of the C-2C ladder 204 when the switch 310 is enabled (e.g., during the duration corresponding to Clk[n+1] of the input reference clock signal 602).

Figure 7:
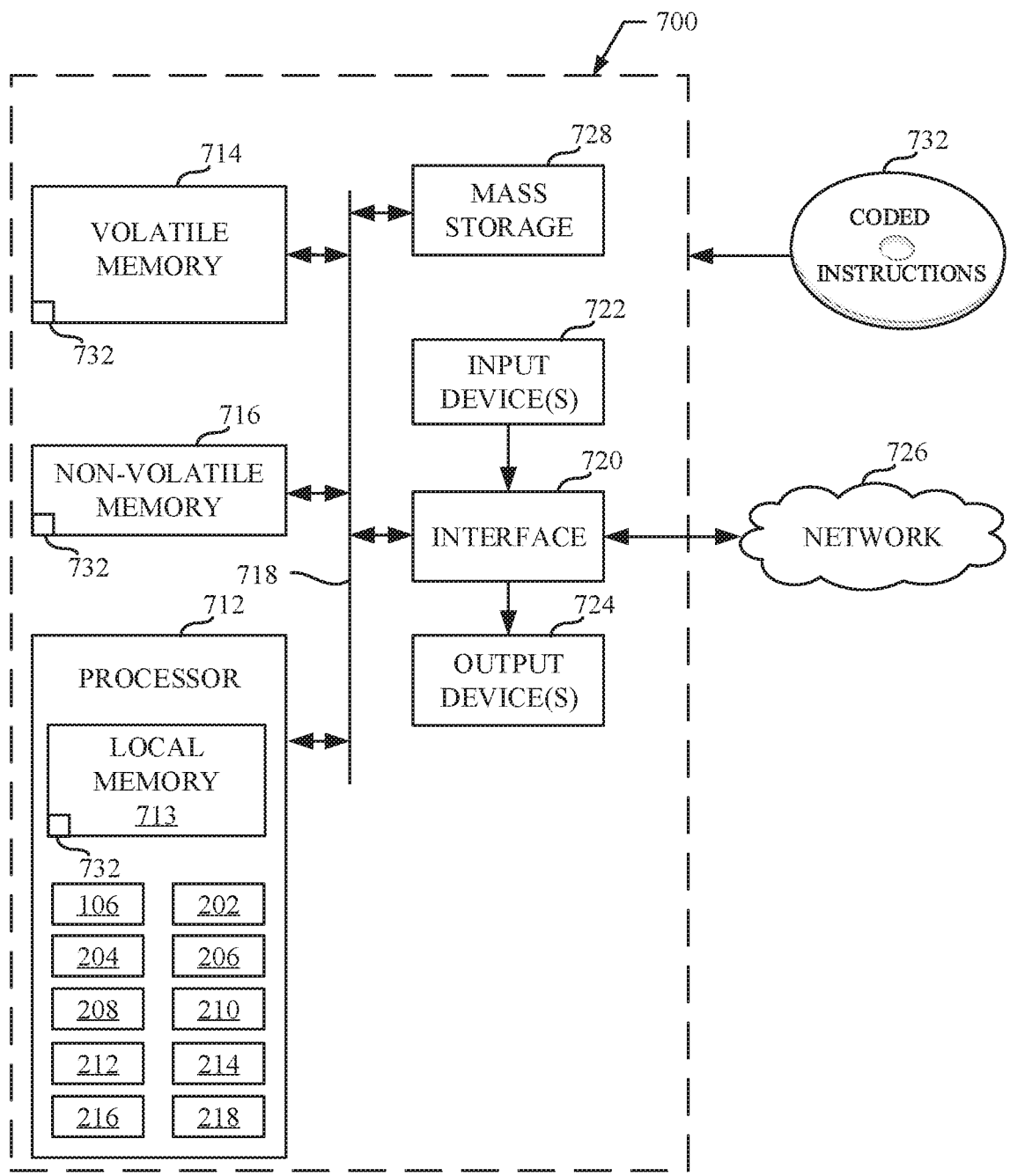
FIG. 7 is a block diagram of an example processing platform structured to execute the instructions of FIG. 5A-5B to implement the example neuron of FIGS. 1-3.

FIG. 7 is a block diagram of an example processor platform 700 structured to execute the instructions of FIGS. 5A-5B to implement the example BNN 104 of FIGS. 1-4 The processor platform 700 can be, for example, a server, a personal computer, a workstation, a self-learning machine (e.g., a neural network), a mobile device (e.g., a cell phone, a smart phone, a tablet such as an iPad), a personal digital assistant (PDA), an Internet appliance, or any other type of computing device.

The processor platform 700 of the illustrated example includes a processor 712. The processor 712 of the illustrated example is hardware. For example, the processor 712 can be implemented by one or more integrated circuits, logic circuits, microprocessors, GPUs, DSPs, or controllers from any desired family or manufacturer. The hardware processor may be a semiconductor based (e.g., silicon based) device. In this example, the processor 712 implements at least one of the example reference clock 106, the example memory interface 202, the example variance-to-resistance converter 206, the example clock interface 208, the example entropy source 210, the example voltage sampler 212, the example charge pump 214, the example weight applicator 216, and the example sleep controller 218.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 716 may be implemented by flash memory and/or any other desired type of memory device. Access to the main memory 714, 716 is controlled by a memory controller. The example local memory 713, the example volatile memory 714, and/or the example non-volatile memory 716 can implement the memory 108 of FIG. 1.

The processor platform 700 of the illustrated example also includes an interface circuit 720. The interface circuit 720 may be implemented by any type of interface standard, such as an Ethernet interface, a universal serial bus (USB), a Bluetooth® interface, a near field communication (NFC) interface, and/or a PCI express interface.

In the illustrated example, one or more input devices 722 are connected to the interface circuit 720. The input device(s) 722 permit(s) a user to enter data and/or commands into the processor 712. The input device(s) can be implemented by, for example, an audio sensor, a microphone, a camera (still or video), a keyboard, a button, a mouse, a touchscreen, a track-pad, a trackball, and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, and/or speaker. The interface circuit 720 of the illustrated example, thus, typically includes a graphics driver card, a graphics driver chip and/or a graphics driver processor.

The interface circuit 720 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 726. The communication can be via, for example, an Ethernet connection, a digital subscriber line (DSL) connection, a telephone line connection, a coaxial cable system, a satellite system, a line-of-site wireless system, a cellular system, etc.

The processor platform 700 of the illustrated example also includes one or more mass storage devices 728 for storing software and/or data. Examples of such mass storage devices 728 include floppy disk drives, hard drive disks, compact disk drives, Blu-ray disk drives, redundant array of independent disks (RAID) systems, and digital versatile disk (DVD) drives.

The machine executable instructions 732 of FIGS. 5A and/or 5B may be stored in the mass storage device 728, in the volatile memory 714, in the non-volatile memory 716, and/or on a removable non-transitory computer readable storage medium such as a CD or DVD.

Example methods, apparatus, systems, and articles of manufacture to provide and operate an improved Bayesian neural network disclosed herein. Further examples and combinations thereof include the following: Example 1 includes an apparatus comprising an oscillator to generate a first clock signal, a resistive element to adjust a slope of a rising edge of a second clock signal, a voltage sampler to generate a sample based on at least one of (a) a first voltage of the first clock signal when a second voltage of the second clock signal satisfies a threshold or (b) a third voltage of the second clock signal when a fourth voltage of the first clock signal satisfies the threshold, and a charge pump to adjust a weight based on the sample, the weight to adjust data in a model.

Example 2 includes the apparatus of example 1, wherein the oscillator is a jittery ring oscillator.

Example 3 includes the apparatus of example 1, wherein the resistive element is a variable resistor, further including a converter to adjust a resistance of the variable resistor based on a value determined during training.

Example 4 includes the apparatus of example 4, wherein the value corresponds to an amount of variance for the adjusted weight.

Example 5 includes the apparatus of example 1, wherein the second clock signal is a jitter free reference signal corresponding to a reference clock.

Example 6 includes the apparatus of example 1, further including a C-2C ladder to generate the weight.

Example 7 includes the apparatus of example 6, wherein the C-2C ladder includes a number of bit cells corresponds to a bit-wise value of a mean value determined during training, the bit cells coupled to the respective storage cells corresponding to the mean value.

Example 8 includes the apparatus of example 1, wherein the sample is a first sample the voltage sampler to generate the first sample during a first clock cycle, and generate a second sample during a second clock cycle, and the charge pump to adjust the weight based on a difference between the first sample and a second sample.

Example 9 includes the apparatus of example 8, wherein the charge pump is to adjust the weight by pumping a first amount of current toward ground during a first duration of time, the first amount of current corresponding to the first sample, and pumping a second amount of current toward an output node during a second duration of time, the second amount of corresponding to the second sample.

Example 10 includes the apparatus of example 1, wherein the adjusted weight follows a probability distribution corresponding to a mean value and a variance value determined during training.

Example 11 includes a neuron in a neural network, the neuron including a C-2C ladder to generate an output voltage corresponding to a mean weight value determined during training a voltage sampler to sample a first voltage of a first clock signal when a second voltage of a second clock signal satisfies a threshold, and a charge pump to adjust the output voltage based on the sample.

Example 12 includes the neuron of example 11, further including a jitter oscillator to generate the second clock signal.

Example 13 includes the neuron of example 11, further including a buffer to output the first clock signal, the first clock signal corresponding to a reference clock signal after being modulated.

Example 14 includes the neuron of example 11, wherein the C-2C ladder includes a number of bit cells corresponds to a bit-wise value of the mean value, the bit cells coupled to the respective storage cells corresponding to the mean value.

Example 15 includes the neuron of example 11, wherein the sample is a first sample the voltage sampler to generate the first sample during a first clock cycle, and generate a second sample during a second clock cycle, and the charge pump to adjust the weight based on a difference between the first sample and a second sample.

Example 16 includes the neuron of example 15, wherein the charge pump is to adjust the weigh by pumping a first amount of current toward ground during a first duration of time, the amount of current corresponding to the first sample, and pumping a second amount of current toward an output node during a second duration of time, the second amount of corresponding to the second sample.

Example 17 includes the neuron of example 11, wherein the adjusted weight follows a probability distribution corresponding to a mean value and a variance value determined during training.

Example 18 includes a neural network comprising memory to store a mean value and a variance value, a reference clock to output a reference clock signal, and a neuron coupled to the memory and the reference clock, the neuron to generate an output voltage corresponding to the mean value using a C-2C ladder, and adjust the output voltage corresponding to the variance value using, an oscillator, a charge pump, and the reference clock signal.

Example 19 includes the neural network of example 18, further including a voltage sampler to sample a voltage corresponding to the reference clock signal based on an output signal of the oscillator.

Example 20 includes the neural network of example 18, wherein the charge pump is to adjust the output voltage based on the sample.

From the foregoing, it will be appreciated that example methods, apparatus and articles of manufacture have been disclosed that provide an improved Bayesian neural network and methods and apparatus to operate the same. Examples disclosed herein leverage the Gaussian distribution corresponding to randomly dithering charge in the analog domain. Examples disclosed herein generates a BNN using (1) a C-2C ladder to converts the mean weight into an electric charge level, (2) a jittery oscillator sampling-based entropy source that provides programmable randomness, and (3) a charge pump controlled by the entropy source to dither the charge generated by the C-2C ladder to give the final, programmable, and Gaussian distributed output.

BNNs introduce uncertainty information to overcome the problems of overfitting and sensitivity to malicious attacks. Instead of using fixed weights, BNNs introduce weights associated with conditioned probability distribution (e.g., the output weight may be a value within a probability distribution defined by a mean and standard deviation). Because BNNs introduce some amount of randomness, BNNs can be trained with smaller training data without sacrificing accuracy. However, traditional BNNs with neurons that generate values corresponding to a probability distribution require a lot of power and/or hardware to implement. Therefore, such traditional BNNs are expensive, complex, and energy inefficient. Examples disclosed herein correspond to a BNN that is implemented with less hardware (and thus less expensive) and is more energy efficient than traditional BNNs. Accordingly, the disclosed methods, apparatus and articles of manufacture are accordingly directed to one or more improvement(s) in the functioning of a neural network.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
   ladder circuitry to generate a weight for a model;
   an oscillator to generate a first clock signal;
   a resistive element to adjust a slope of a rising edge of a second clock signal; and
   a charge pump to adjust the weight for the model based on a first voltage of the first clock signal when a second voltage of the second clock signal satisfies a threshold.

2. The apparatus of claim 1, wherein the oscillator is a jittery ring oscillator.

3. The apparatus of claim 1, wherein the resistive element is a variable resistor, further including a converter to adjust a resistance of the variable resistor based on a value determined during training.

4. The apparatus of claim 3, wherein the value corresponds to an amount of variance for the adjusted weight.

5. The apparatus of claim 1, wherein the second clock signal is a jitter free reference signal corresponding to a reference clock.

6. The apparatus of claim 1, wherein the ladder circuitry includes a number of bit cells corresponds to a bit-wise value of a mean value determined during training, the bit cells coupled to the respective storage cells corresponding to the mean value.

7. The apparatus of claim 1, further including:
   a voltage sampler to:
     generate a first sample during a first clock cycle; and
     generate a second sample during a second clock cycle; and
   the charge pump to adjust the weight based on a difference between the first sample and the second sample.

8. The apparatus of claim 7, wherein the charge pump is to adjust the weight by:
   pumping a first amount of current toward ground during a first duration of time, the first amount of current corresponding to the first sample; and
   pumping a second amount of current toward an output node during a second duration of time, the second amount of corresponding to the second sample.

9. The apparatus of claim 1, wherein the adjusted weight corresponds to a probability distribution based on a mean value and a variance value determined during training.

10. A neuron in a neural network, the neuron including:
    ladder circuitry to generate an output voltage corresponding to a mean weight value determined during training; and
    a charge pump to adjust the output voltage based on a first voltage of a first clock signal when a second voltage of a second clock signal satisfies a threshold.

11. The neuron of claim 10, further including a jitter oscillator to generate the second clock signal.

12. The neuron of claim 10, further including a buffer to output the first clock signal, the first clock signal corresponding to a reference clock signal after being modulated.

13. The neuron of claim 10, wherein the ladder circuitry includes a number of bit cells corresponds to a bit-wise value of the mean weight value, the bit cells coupled to the respective storage cells corresponding to the mean weight value.

14. The neuron of claim 10, further including:
    a voltage sampler to:
      generate a first sample during a first clock cycle; and
      generate a second sample during a second clock cycle; and
    the charge pump to adjust the output voltage based on a difference between the first sample and the second sample.

15. The neuron of claim 14, wherein the charge pump is to adjust the output voltage by:
    pumping a first amount of current toward ground during a first duration of time, the first amount of current corresponding to the first sample; and
    pumping a second amount of current toward an output node during a second duration of time, the second amount of corresponding to the second sample.

16. The neuron of claim 10, wherein the adjusted output voltage corresponds to a probability distribution based on a mean value and a variance value determined during training.

17. A neural network comprising:
   memory to store a mean value and a variance value;
   a reference clock to output a reference clock signal; and
   a neuron coupled to the memory and the reference clock, the neuron to:
      generate an output voltage corresponding to the mean value using a C-2C ladder; and
      adjust, with a charge pump, the output voltage corresponding to the variance value, the variance value based on a first voltage of the reference clock signal when a second voltage of an oscillator satisfies a threshold.

18. The neural network of claim 17, further including a voltage sampler to sample a voltage corresponding to the reference clock signal based on an output signal of the oscillator.

19. The apparatus of claim 1, further including a voltage sampler to determine at least one of: (a) the first voltage of the first clock signal when the second voltage of the second clock signal satisfies the threshold, or (b) a third voltage of the second clock signal when a fourth voltage of the first clock signal satisfies the threshold.

20. The neuron of claim 10, further including a voltage sampler to sample the first voltage of the first clock signal when the second voltage of the second clock signal satisfies the threshold.

* * * * *